United States Patent [19]

Vaes

[11] Patent Number: 4,860,078
[45] Date of Patent: Aug. 22, 1989

[54] HIGH-FREQUENCY TRANSISTOR WITH LOW INTERNAL CAPACITANCE AND LOW THERMAL RESISTANCE

[75] Inventor: Henricus M. J. Vaes, Eindhoven, Netherlands

[73] Assignee: U.S. Philips Corp., New York, N.Y.

[21] Appl. No.: 287,510

[22] Filed: Dec. 19, 1988

Related U.S. Application Data

[63] Continuation of Ser. No. 935,994, Nov. 28, 1986, abandoned.

[30] Foreign Application Priority Data

Dec. 11, 1985 [NL] Netherlands ............... 8503408

[51] Int. Cl.⁴ .................................... H01L 29/72
[52] U.S. Cl. ................................ 357/34; 357/59
[58] Field of Search ............. 357/34, 59, 36, 46, 357/49

[56] References Cited

U.S. PATENT DOCUMENTS

| | | | |
|---|---|---|---|
| 4,338,138 | 7/1982 | Cavaliere et al. | 357/34 |
| 4,368,573 | 1/1983 | DeBrebisson et al. | 357/34 |

FOREIGN PATENT DOCUMENTS

| | | | |
|---|---|---|---|
| 0170250 | 5/1986 | European Pat. Off. | 357/34 |
| 45-31132 | 10/1970 | Japan | 357/34 |
| 55-26601 | 2/1980 | Japan | 357/34 |
| 56-94770 | 7/1981 | Japan | 357/34 |
| 58-110075 | 6/1983 | Japan | 357/34 |

OTHER PUBLICATIONS

Ning; T. H. et al., *IBM Tech. Disc. Bull.*, vol. 22, No. 5, Oct. 1979, pp. 2123-2126.
Jambotkar, C. G., *IBM Tech. Disc. Bull.*, vol. 19, No. 3, Aug. 1976, pp. 915-918.

*Primary Examiner*—Andrew J. James
*Assistant Examiner*—Sara W. Crang
*Attorney, Agent, or Firm*—Steven R. Biren

[57] ABSTRACT

A high-frequency transistor having a substrate of a first conductivity type, an epitaxial collector layer of the first conductivity type, a layer-shaped base region of the second opposite conductivity type, which is provided in the collector layer and is subdivided by a sunken oxide pattern into a number of base zones which are interconnected by conducting layers located on the oxide pattern, and at least one emitter zone of the first conductivity type in each base zone. According to the invention, the conducting layers consist of poly-crystalline silicon of which an edge is covered with a thin oxide layer which extends into the base zone and laterally bounds the emitter zones.

4 Claims, 3 Drawing Sheets

HIGH-FREQUENCY TRANSISTOR WITH LOW INTERNAL CAPACITANCE AND LOW THERMAL RESISTANCE

This is a continuation of application Ser. No. 935,994, filed Nov. 28, 1986, now abandoned.

BACKGROUND OF THE INVENTION

The invention relates to a high-frequency transistor including a semiconductor body of silicon having a highly-doped substrate of a first conductivity type, a more weakly-doped epitaxial layer of the first conductivity type disposed on it, a layer-shaped base region of the second, opposite conductivity type provided in the epitaxial layer and a pattern of silicon oxide at least in part countersunk into the epitaxial layer and subdividing the base region into a number of mutually separated base zones, which are interconnected by conducting layers located on the isolating pattern, at least one emitter zone of the first conductivity type being provided in each base zone.

The invention also relates to a method of manufacturing the device.

A high-frequency transistor of the kind described is known from the published Japanese Patent Application (Kokai) No. 56-94770.

High-frequency transistors are used for various purposes, more particularly as transistors for broadband antenna amplifiers and as transmitter transistors. They should satisfy a number of requirements. The most important requirements are that a high amplification is obtained within a wide frequency range and a long life is achieved (generally associated with a low thermal resistance).

These requirements can be satisfied by a transistor structure, which has, in addition to narrow strip-shaped emitter zones a low emitter-base and base-collector capacitance and further a low thermal resistance. The term "thermal resistance" is to be understood to mean the maximum temperature difference between the base-collector junction and the heat sink divided by the dissipated power.

However, these three requirements are contradictory to a certain extent. Starting from a transistor structure comprising a number of emitter zones or emitter "fingers" in a common base zone, with unchanged distance between the emitter zones and with unchanged emitter surfaces area, a reduction of the width (and hence an increase of the number) of the emitter zones will lead to a larger base surface area, which gives rise on the one hand to a lower thermal resistance, but on the other hand to a higher base-collector capacitance, efforts can then be made to reduce the base surface area and hence the base-collector capacitance by reduction of the distance between the emitter zones, but this again leads to an increase of the thermal resistance. A known method of reducting the thermal resistance consists in that the emitter zones are distributed over several mutually-separated base zones. As a result, however the base-collector capacitance again increases.

With the construction of a transistor according to the aforementioned Japanese Patent Application No. 56-94770, a layer-shaped base region is subdivided into mutually-separated base zones by a sunken oxide pattern. Thus, it is possible to space the base zones apart by an arbitrarily large distance and hence to obtain a low thermal resistance without increasing the base-collector capacitance.

However, a disadvantage of this transistor is that the emitter-base capacitance is high due to the fact that the emitter-base junction in the form of a planar p-n junction is bounded by highly doped base contact zones. A further disadvantage is that the manufacture of this transistor requires a fairly complicated technology, which inter alia comprises an underetching step. Such an under-etching step is often poorly reproducible, which is disadvantageous especially with the fine structure used in high-frequency transistors.

SUMMARY OF THE INVENTION

The invention has inter alia for its object to provide a high-frequency transistor having a low base-collector capacitance and a low thermal resistance, while moreover the emitter-base capacitance is kept very low. The invention further has for its object to provide a method of manufacturing this transistor, which guarantees a very high reproducibility associated with a high degree of self-alignment.

According to the invention, a high-frequency transistor of the kind described above is characterized in that the conducting layers each comprise a silicon layer of the second conductivity type, of which at least the edge is covered by a thin oxide layer extending into the base zone, and in that the emitter zones are laterally bounded by said thin oxide layers.

Due to the fact that in the transistor according to the invention the emitter-base junction adjoins the said thin oxide, the capacitance of this junction is considerably reduced, even if, according to a preferred embodiment, highly doped base contact zones are provided beside the emitter zone, which are then in fact separated from the emitter zone by said thin oxide layer.

The use of silicon layers as a connection between the base zones further provides the possibility of determining in a reproducible manner the position and the thickness of said thin oxide layers by utilizing the accurately controllable thermal oxidation of the edge of an auxiliary silicon layer.

According to a further preferred embodiment, the emitter zones are covered with silicon layers of the first conductivity type, which are formed from the same silicon layer as the layers of these conductivity type interconnecting the base zones.

The invention further relates to a method of manufacturing such a high-frequency transistor, which method is characterized by the following processing steps:

depositing an epitaxial layer of a first conductivity type on a highly doped silicon substrate of the first conductivity type, providing an anti-oxidation mask on the epitaxial layer for defining the base zones, thermal oxidizing the uncovered part of the epitaxial layer for forming an at least countersunk oxide pattern, depositing, after removal of the anti-oxidation mask, in order of succession on the epitaxial layer and on the oxide pattern a first silicon layer, a first silicon layer, a first anti-oxidation layer, a second silicon layer and a second anti-oxidation layer, etching the second anti-oxidation layer in such a manner that it subsists at least at the area of the emitter zones to be provided, etching away the uncovered parts of the second silicon layer, thermally oxidizing the second silicon layer for forming oxidized edge parts thereof, etching away the uncovered parts of the first anti-oxidation layer, doping the uncovered first parts of the first silicon layer with a dopant of the second conductivity type, etching away the exposed oxide parts, thermally oxidizing the uncovered silicon and simultaneously forming base contact zones by diffusion from the first silicon layer, etching away the uncovered parts of the anti-oxidation layer, etching away the uncovered parts of the silicon layers, filling by thermal oxidation the grooves in the first silicon layer thus formed and extending into the epitaxial layer, implanting a dopant of the first conductivity type through the nonoxidized second parts of the first silicon layer for forming emitter zones of the first conductivity type, which adjoin the oxidized grooves, and providing base and emitter contacts on the said first and second parts of the first silicon layer.

BRIEF DESCRIPTION OF THE DRAWING

The invention will now be described more fully with reference to an embodiment and the drawing, in which.

The Figures are schematic and not drawn to scale. Corresponding parts are generally designated by like reference numerals. Semiconductor regions of the same conductivity type are generally hatched in the same direction in the cross-sections.

DESCRIPTION OF THE PREFERRED EMBODIMENTS

Figure 1:
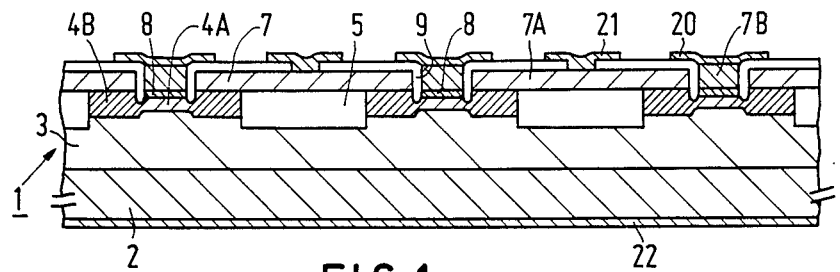
FIG. 1 shows diagrammatically in cross-sectional view a high-frequency transistor according to the invention.
Figure 2:
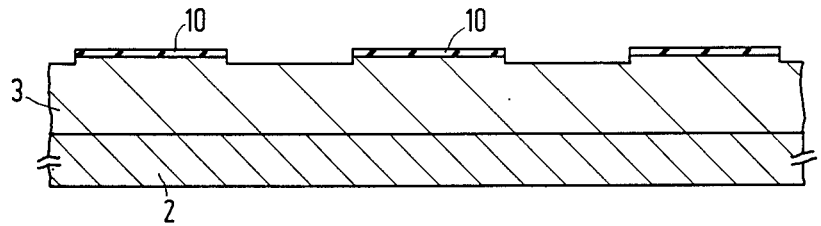
FIGS. 2 to 8 show diagrammatically cross-sections at successive stages of manufacture of the high-frequency transistor according to the invention.

FIG. 1 shows diagrammatically in cross-section a high-frequency transistor according to the invention. The transistor has a semiconductor body 1 of silicon comprising a highly doped substrate 2 of a first conductivity type and a more weakly doped epitaxial layer 3 of the same conductivity type disposed on it. In this embodiment, both the substrate and the epitaxial layer are of the n-conductivity type. However it will be appreciated that, instead thereof, a highly doped p-type substrate with a p-type epitaxial layer disposed on it may be used as well.

A layer-shaped base region (4A, B) of the second opposite (so in this case p) conductivity type is provided in the epitaxial layer 3. The transistor further comprises a pattern 5 of silicon oxide, which is at least partly countersunk into the epitaxial layer 3 and subdivides the base region (4A, B) into a number of mutually separated base zones. These base zones are interconnected by conducting layers, which are disposed on the isolating pattern 5 and are constituted in this embodiment by strongly p-type conducting layers 7 (cf. FIG. 1). An emitter zone 8 of the first conductivity type (so in this case the n-conductivity type) is provided in each base zone.

According to the invention, the conducting layers 7 each comprise a silicon layer of the second (so in this case p) conductivity type, of which at least the edge is covered with a thin oxide layer 9 extending onto the base zone (4A, B), while further the emitter zones 8 are laterally bounded by these thin oxide layers 9.

In this embodiment, the base zones are provided with highly doped base contact zones 4B, which are bounded by the sunken oxide pattern 5 and are separated by the thin oxide layers 9 from the also highly doped n-type emitter zones. As a result, the transistor according to the invention has in addition to a comparatively low base-collector capacitance and a comparatively low thermal resistance a low emitter-base capacitance, which favorably influences the high-frequency properties.

However, besides this electrical advantage, the high-frequency transistor according to the invention has the major advantage that it can be manufactured in a reproducible and comparatively simple manner with a minimum number of masking and alignment steps.

The manufacture of the high-frequency transistor shown in FIG. 1 will now be described with reference to FIGS. 2 to 8, which show diagrammatically in cross-section the transistor in successive stages of manufacture in the same plane of intersection as FIG. 1.

Starting material (cf. FIG. 2) is a highly doped n-type substrate 2 of silicon with an n-type conducting epitaxial layer 3 grown on it and having a thickness of, for example, 2 μm and a resistivity of about 1 Ω.cm. An anti-oxidation mask 10 is provided on the layer 3 for defining the base zones. This mask 10 may consist, for example, of a silicon nitride layer, which mostly is provided on a very thin oxide layer not shown here. If desired other anti-oxidation layers, provided that they are selectively etchable with respect to silicon oxide, may be used as well.

The mask 10 is etched into shape in a usual manner by means of a photolacquer mask, which can also be used to etch the silicon not covered by the mask 10 down to a certain depth in order to obtain an oxide pattern entirely sunken into the layer 3. However, this is not necessary. Furthermore, a number of measures may be taken to make the oxide pattern to be formed as flat as possible and to counteract the occurrence of the so-called "bird's beak" effect. Since all this is not essential to the invention, it will not be described here in detail.

Figure 3:
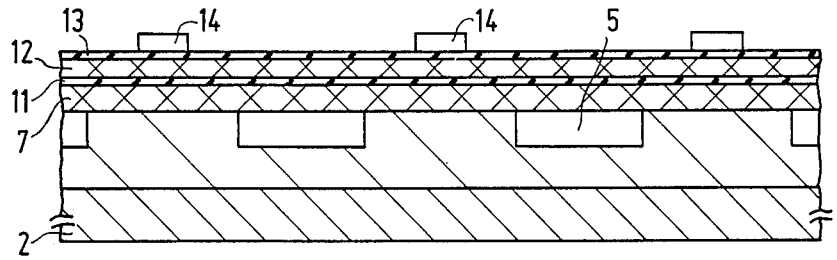

The uncovered part of the epitaxial layer is then thermally oxidized, thus forming an oxide pattern 5 countersunk at least in part—in this embodiment entirely—into it (cf. FIG. 3). This countersunk oxide pattern has a thickness of, for example, 1.75 μm and is obtained by oxidation in moist oxygen for 13 hours at a temperature of 1000° C.

Subsequently, the anti-oxidation mask 10 is removed, for example by etching away the silicon nitride in hot phosphoric acid and by etching the subjacent oxide in a buffered HF solution. A first silicon layer 7, a first anti-oxidation layer 11, a second silicon layer 12 and a second anti-oxidation layer 13 are now successively applied to the epitaxial layer 3 and to the oxide pattern 5 (cf. FIG. 3). The layers 11 and 13 in this embodiment are silicon nitride or nitride-oxide layers; the silicon layers 7 and 12 are deposited as polycrystalline silicon by decomposition of a gaseous silicon compound, such as, for example, $SiH_4$ or $SiCl_4$. They are not intentionally doped and are generally described as being undoped, although a weak n- or p-doping is always present. In this embodiment, the silicon layer 7 has a thickness of 0.5 μm and the layer 12 has a thickness of 0.35 μm, while the anti-oxidation layers 11 and 13 have a thickness of 80 nm.

The second anti-oxidation layer 13 is now etched in such a manner that it subsists at least at the area of the emitter zones to be provided. This may be effected by means of an oxide mask 14 (cf. FIG. 3). Although in this embodiment only one emitter zone is provided in each base zone, of course several emitter zones may be provided on each base zone.

Figure 4:
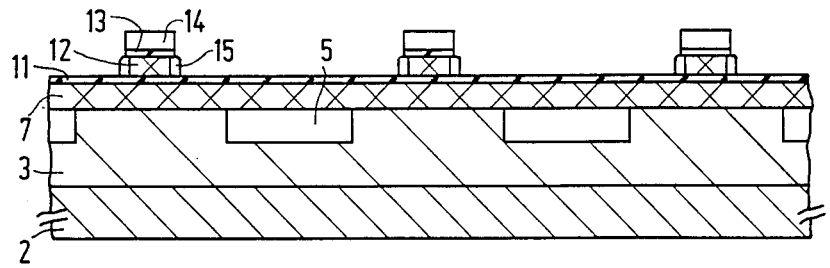

After the anti-oxidation layer 13 has been etched, the uncovered parts of the second silicon layer 12 are also etched, whereupon the remaining parts of the layer 12 are provided with oxidized edge portions 15 by thermal oxidation (cf. FIG. 4). The thermal oxidation may be effected, for example, in moist oxygen at a temperature of 900° C. for 9 hours, edge portions 15 having a width of about 0,7 μm being formed.

Figure 5:
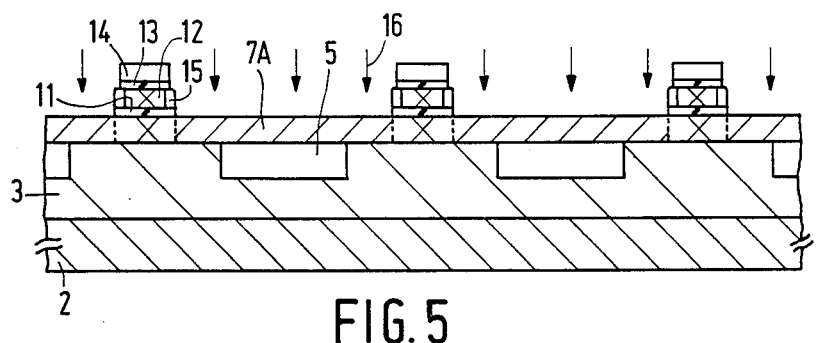

The uncovered parts of the first anti-oxidation layer 11 are now etched away, after which the first parts 7A of the first silicon layer 7 thus exposed are rendered strongly p-conducting by implantation of, for example, boron ions 16 (cf. FIG. 5). For example, the dose is $5.10^{15}$ ions/cm$^2$ and the energy is 100 keV.

Figure 6:
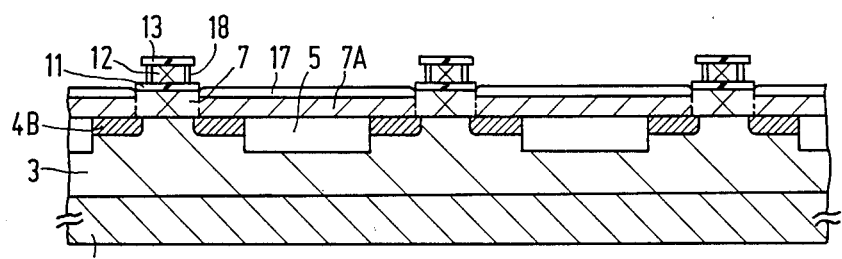
Figure 7:
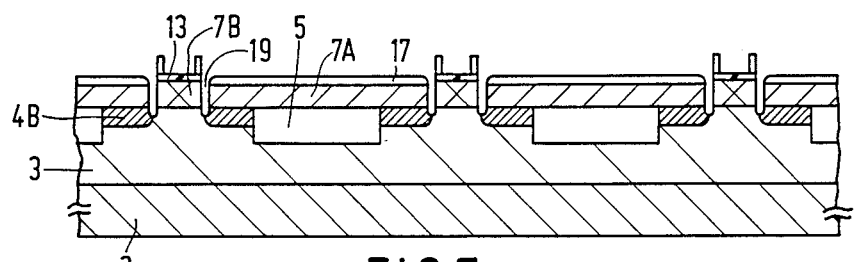
Figure 8:
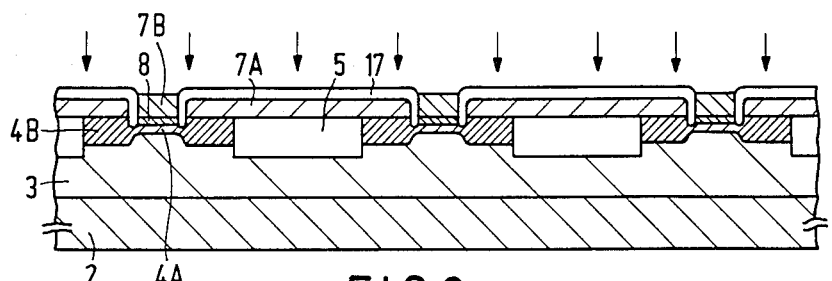

All the exposed oxide parts (14 and 15) are now etched away, whereupon the uncovered silicon is thermally lightly oxidized (cf. FIG. 6). The oxide layers 17 and 18 are then obtained. During this operation and during the following heating steps, the base contact regions 4B are obtained by diffusion of boron from the layer parts 7A into the layer 3.

Subsequently, the uncovered parts of the anti-oxidation layers 11 and 13 and the uncovered parts of the silicon layers 7 and 12 are successively removed by etching. Grooves 19 are then formed in the layer 7, these grooves extending into the epitaxial layer 3 (cf. FIG. 7). By thermal oxidation, these grooves are then filled with oxide. During the oxidation the thickness of the oxide layers 17 is also slightly increased (cf. FIG. 8).

More weakly doped p-type base zones 4A and more highly doped n-type emitter zones 8 are then formed in the non-oxidized second parts 7B of the first silicon layer 7 above the base regions, the n-type doping being so much higher than the p-type doping that the part 7B of the silicon layer obtains a high n-type doping after implantation. Before these implantations are carried out, the anti-oxidation layer 13 will be preferably first etched away selectively, although this is not absolutely necessary and implantation could also take place through the layer 13. The doping ions used are preferably boron and arsenic ions; the doses and the implantation energy depend upon the desired emitter and base depths. In this embodiment, first boron was implanted at an energy of 25 keV and a dose of $10^{15}$ ions/cm$^2$ and then arsenic was implanted at an energy of 100 keV and a dose of $10^{16}$ ions/cm$^2$, whereupon an annealing treatment was carried out at 990° C. for 60 minutes. It must then be ensured that the depth of the emitter-base junction is smaller then that of the grooves 19 so that the emitter zone is bounded by the oxidized groove. The implantations may also be carried out in reverse order of succession.

Finally, emitter contacts 20 are formed on the silicon layer parts 7B and base contacts 21 are formed through contact windows in the oxide layers 17 on the silicon layer parts 7A, while the substrate 2 is provided with a collector contact 22 (cf. FIG. 1). The emitter and base metallizations may be provided so as to be interdigitated.

Figure 9:
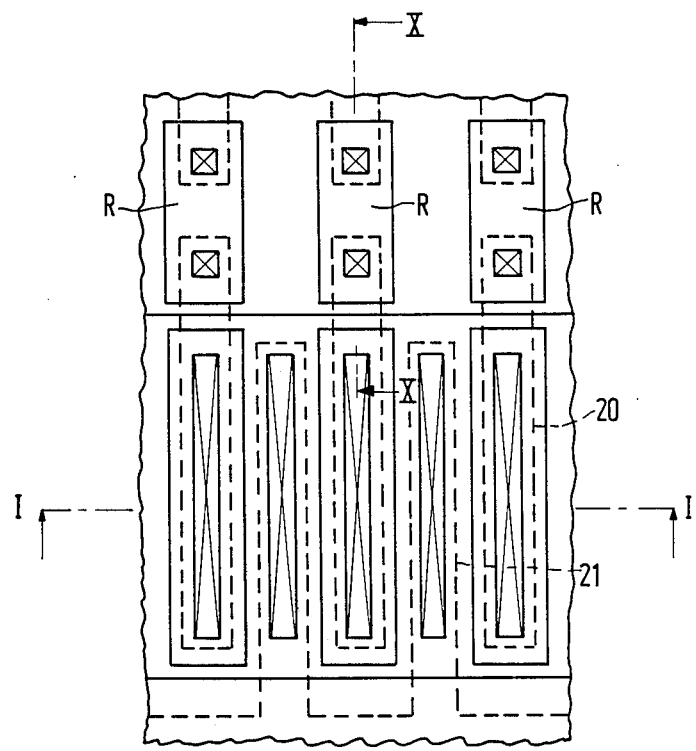
FIG. 9 is a plan view of the transistor.
Figure 10:
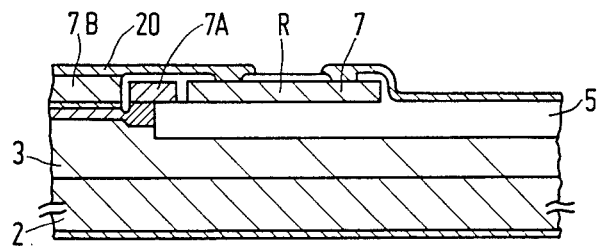
FIG. 10 is a cross-sectional view taken on the line X—X.

Various modifications are possible. For example, parts of the first silicon layer 7 may also be used as emitter ballast resistors. FIG. 9 is a plan view of a transistor having such emitter ballast resistors R. FIG. 1 shows a sectional view taken on the line I—I and FIG. 10 shows a cross-sectional view taken on the line X—X of the transistor of FIG. 9. In FIG. 9, the contours of the metallization are indicated by dotted lines; the areas at which the metallization is in contact with a silicon surface (the contact windows) are indicated by diagonal lines. The oxidized grooves surrounding the resistance region may be formed in the same processing step as in FIG. 7; the part of the silicon layer 7 forming the resistor R may be doped, for example, with arsenic during the implantation step of FIG. 8.

The invention is not limited to the embodiments described. More particularly the conductivity types may be replaced (all simultaneously) by the opposite types. Furthermore, other layer thicknesses and other implantation doses and energies may be used, while other donor and acceptor ions may be employed. Instead of at the end of the process, the base region may also be provided as a surface layer of the second conductivity type in the epitaxial layer before the countersunk oxide pattern is provided, after which it is subdivided into mutually separated base zones by said oxide pattern.

What is claimed is:

1. A high-frequency transistor comprising a semiconductor body of silicon having a highly-doped substrate of a first conductivity type, a more weakly-doped epitaxial layer of the first conductivity type on said substrate, a layer-shaped base region of a second conductivity type opposite to that of the first provided in the epitaxial layer, a pattern of silicon oxide at least partly countersunk into the epitaxial layer and subdividing the base region into a number of mutually-separated base zones, and conducting layers located partly on the isolating pattern for interconnecting said base zones, at least one emitter zone of the first conductivity type being provided in each base zone, the conducting layers each comprising a silicon layer of the second conductivity type, thin oxide layers extending into the base zone and covering at least an edge of each conducting layer, and the emitter zones being laterally bounded by said thin oxide layers such that in projection the edge of the silicon layer is about the thickness of the thin oxide layers away from the emitter zone.

2. A high-frequency transistor as claimed in claim 1, characterized in that the base zones are provided with highly doped base contact zones, which are separated from the emitter zones by said thin oxide layers and are bounded by the countersunk oxide pattern.

3. A high-frequency transistor as claimed in claim 1 or 2, characterized in that the emitter zones are covered with silicon layer of the first conductivity type, which are formed from the same silicon layer as said silicon layers of the second conductivity type and are separated therefrom by grooves, which are filled with said thin oxide layers.

4. A high-frequency transistor as claimed in claim 1 or 2, characterized in that the silicon layers of the second conductivity type are covered by said thin oxide layer and are connected through contact windows in this oxide layer to metal layers forming the base connection.

* * * * *